United States Patent [19]
Kromat

[11] Patent Number: 6,081,167
[45] Date of Patent: Jun. 27, 2000

[54] FULLY INTEGRATABLE VOLTAGE CONTROLLED OSCILLATOR (VCO) CIRCUIT

[75] Inventor: Oliver Kromat, Bochum, Germany

[73] Assignee: Siemens Aktiengesellschaft, Munich, Germany

[21] Appl. No.: 09/259,642

[22] Filed: Mar. 1, 1999

[30] Foreign Application Priority Data

Feb. 27, 1998 [DE] Germany ............ 198 08 377

[51] Int. Cl.[7] ............... H03B 5/12; H03B 5/18
[52] U.S. Cl. ............... 331/108 C; 331/117 R; 331/117 FE; 331/117 D; 331/177 V
[58] Field of Search ............ 331/117 R, 117 FE, 331/177 V, 108 C, 117 D

[56] References Cited

U.S. PATENT DOCUMENTS

| | | | |
|---|---|---|---|
| 5,434,544 | 7/1995 | Van Veenendaal | 331/117 R |
| 5,847,621 | 12/1998 | Gutierrez | 331/177 R |
| 6,016,082 | 1/2000 | Cruz et al. | 331/117 FE |

FOREIGN PATENT DOCUMENTS

4331499A1  3/1995  Germany .

OTHER PUBLICATIONS

"A Balanced 1.5Ghz Voltage Controlled Oscillator with an Integrated LC Resonator", Leonard Dauphinee et al., 1997 IEEE International Solid–State Circuits Conference, pp. 390–391.

"Silicon Bipolar VCO Family for 1.1 to 2.2GHz with Fully–Integrated Tank and Tuning Circuits", Bart Jansen et al., 1997 IEEE International Solid–State Circuits Conference, pp. 392–393.

"A 1.8–GHz CMOS Low–Phase–Noise Voltage–Controlled Oscillator with Prescaler", Jan Craninckx et al., IEEE Journal of Solid–State Circuits, vol. 30, No. 12, 1995, pp. 1474–1482.

"Oscillators with Low Phase Noise and Power Consumption", Ulrich Rhode et al., Communications Quarterly, 1996, pp. 29, 37 and 43.

*Primary Examiner*—Siegfried H. Grimm
*Attorney, Agent, or Firm*—Herbert L. Lerner; Laurence A. Greenberg; Werner H. Stemer

[57] ABSTRACT

A fully integratable voltage controlled oscillator (VCO) circuit includes a tuned circuit having a spiral inductance connected in parallel with a varactor controlled by a control voltage. Damping of the tuned circuit is counteracted by a cross-coupled NIC (Negative Impedance Converter). The cross-coupling of the NIC, which transforms a negative resistance into the tuned circuit, is provided by AC coupling of two outputs. Bipolar transistors are provided only for current source transistors, while in contrast CMOS transistors are provided in a current switch. The VCO can be used, for example, in DECT units.

4 Claims, 1 Drawing Sheet

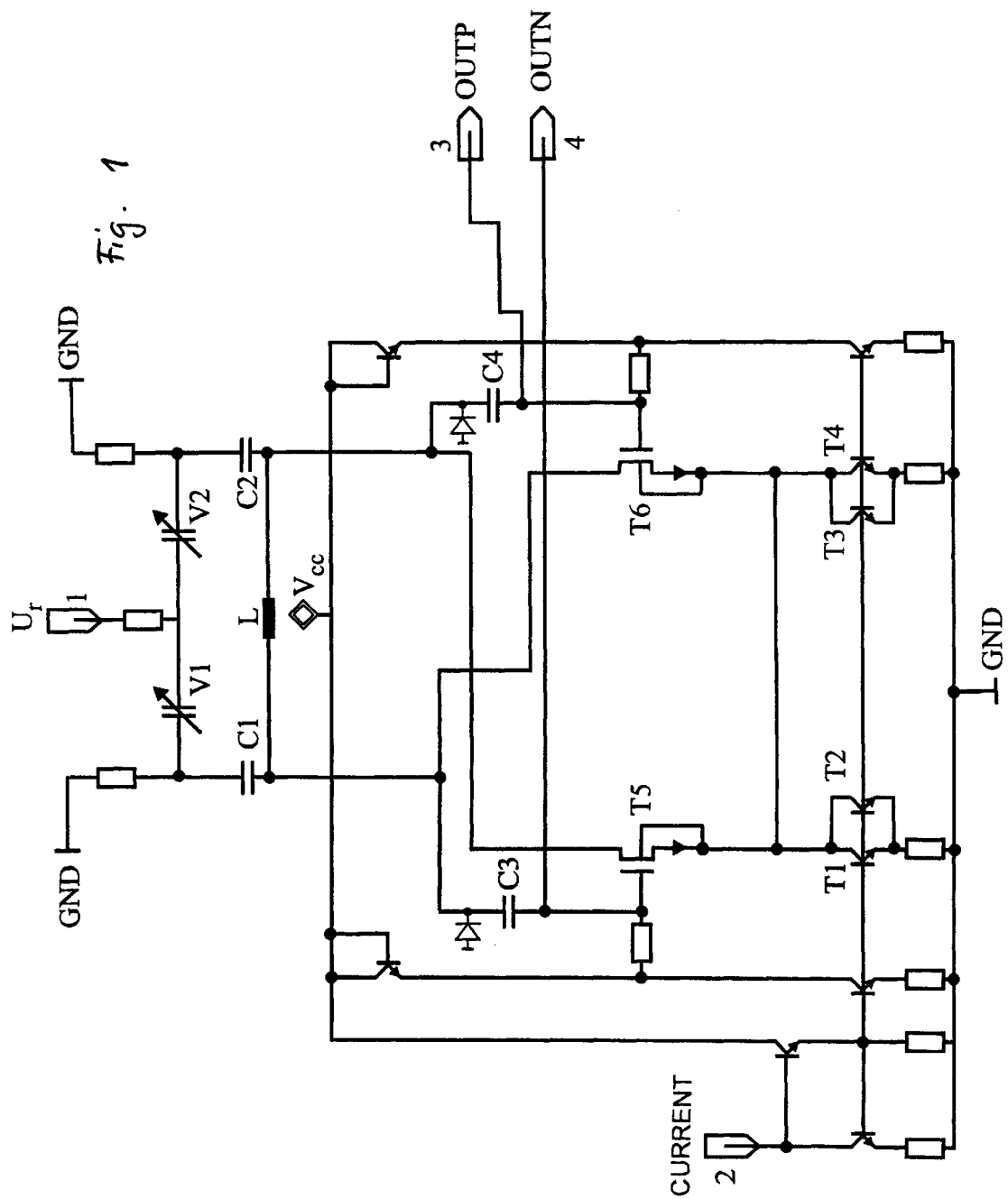

FULLY INTEGRATABLE VOLTAGE CONTROLLED OSCILLATOR (VCO) CIRCUIT

BACKGROUND OF THE INVENTION

Field of the Invention

The invention relates to a fully integratable voltage controlled oscillator (VCO) circuit for producing sinusoidal UHF oscillations, including bipolar transistors, a tuned circuit having an integrated spiral inductance connected in parallel with an integrated varactor having a pn junction acted on by a VCO control voltage governing a resonant frequency, and a cross-coupled so-called NIC (Negative Impedance Converter) circuit transforming a negative resistance into the tuned circuit and counteracting damping of the tuned circuit.

In order to prepare a voice/data signal for optimized transmission using a radio transmission channel (radio), the voice/data signal is modulated onto a so-called radio frequency (RF) carrier. In many applications, the RF carrier is formed of sinusoidal oscillations which are produced by a voltage controlled oscillator (VCO).

Depending on the field of application, for example in the DECT (Digital European Cordless Telecommunications) system (which is transmitted by using the UHF frequency band), GSM (Global System for Mobile Communications) system or in similar systems, the standards which exist for those systems place particular requirements on the voltage controlled oscillator. One of the most important requirements is that the so-called phase noise can be kept low since, for example, that limits the maximum power which can be transmitted in adjacent channels (in the transmission mode) or the maximum power from adjacent channels in the channel being used (in the receiving mode).

Those requirements are generally so stringent that, to date, it has been virtually impossible to produce fully integrated voltage controlled oscillator (VCO) circuits which comply, for example, with the DECT Specification. The critical parameter in the DECT Standard in that case is the VCO phase noise at an offset of 4.7 MHz (third adjacent channel). According to the specification, that is −132 dBc/Hz.

Three integrated voltage controlled UHF oscillator circuits which could, to some extent, satisfy the DECT Specifications are already known from the literature.

The first circuit is based on an article entitled "Silicon Bipolar VCO Family for 1.1 to 2.2 GHz with Fully-Integrated Tank and Tuning Circuits", by Bart Jansen, Kevin Negus and Don Lee, in 1997 IEEE International Solid-State Circuits Conference, ISSCC97/Session 23/Analog Techniques/Papers SP 23.8, Feb. 8, 1997, pages 392 and 393. In that known integrated VCO oscillator, a tuned circuit which includes an integrated spiral inductance connected in parallel with an integrated varactor has its damping counteracted by a circuit which transforms a negative resistance into the tuned circuit. Such a circuit is generally called an NIC (Negative Impedance Converter) circuit.

A control voltage for the VCO is applied to the pn junction of the varactors, through the use of which the total capacitance of the tuned circuit, and thus the oscillation frequency, can be varied. That VCO is formed by bipolar transistors. The advantage of that type of transistor is its low 1/f noise, which is advantageous, particularly for setting operating points.

The disadvantage is the high gradient "gm" (Id/Ut) and the base path resistance of the bipolar transistors. When the NIC circuit passes through its "zero crossing", that is to say both transistors in the current switch are switched on, a relatively large "noise charge packet" is introduced into the tuned circuit and makes itself evident in a disadvantageous manner as phase noise.

The second circuit which is known in that context originates from an article entitled "A Balanced 1.5 GHz Voltage Controlled Oscillator with an Integrated LC Resonator", by Leonard Dauphinee, Miles Copeland and Peter Schvan, in "1997 IEEE International Solid-State Circuits Conference, ISSCC97/Session 23/Analog Techniques/Papers SP 23.7, Feb. 8, 1997", pages 390 and 391, and is based on a differential Colpitts oscillator. That circuit is also formed by bipolar transistors and therefore suffers from the same problem, which has already been described in conjunction with the first known VCO circuit.

The third VCO circuit which is known in that context is based on an article entitled "A 1.8-Ghz CMOS Low-Phase-Noise Voltage-Controlled Oscillator with Prescaler", by Jan Craninckx and Michel S. J. Steyaert, in "IEEE Journal of Solid-State Circuits", Vol. 30, No. 12, December 1995, pages 1474 to 1482 and, in contrast to the first two integrated VCO circuits dealt with above, is formed from CMOS transistors.

A bonding wire inductance is used in the resonant circuit, and that forms a weakness of that technique since the inductance value cannot be reproduced well. The circuit for counteracting the damping of the tuned circuit is not described in any more detail in the article. It can be assumed that an NIC type is also used therein.

The disadvantage of CMOS transistors is the relatively high 1/f noise of that type of transistor. The limit frequency of 1/f noise in CMOS transistors is typically in the MHz region, while in contrast it is in the kHz region for bipolar transistors. The advantage of the CMOS transistor is the relatively low gradient "gm" which makes the noise produced at the current switch changeover time negligibly low.

SUMMARY OF THE INVENTION

It is accordingly an object of the invention to provide a fully integratable voltage controlled oscillator (VCO) circuit, which overcomes the hereinafore-mentioned disadvantages of the heretofore-known devices of this general type, which permits full integration to be reliably achieved, which is operated in the UHF band and which complies with requirements resulting from existing standards, in particular the DECT Standard, especially with regard to phase noise and while taking parameter fluctuations from a semiconductor process into account.

The critical parameter in the DECT Standard in that case is the phase noise of the VCO at an offset of 4.7 MHz (third adjacent channel). According to specifications, that is −132 dBc/Hz, and the VCO oscillator circuit to be provided should thus have a performance of at least −140 dBc/Hz in order to ensure compliance with the specifications even when taking parameter fluctuations from the semiconductor process into account.

With the foregoing and other objects in view there is provided, in accordance with the invention, a fully integratable voltage controlled oscillator circuit for producing sinusoidal UHF oscillations, comprising a tuned circuit including an integrated spiral inductance connected in parallel with an integrated varactor, the integrated varactor having a pn junction acted on by a VCO control voltage governing a resonant frequency; a so-called NIC (Negative Impedance Converter) circuit transforming a negative real resistance into the tuned circuit for counteracting damping of the tuned circuit, the NIC circuit having two outputs AC coupled for cross-coupling of the NIC circuit; bipolar transistors provided only as current source transistors; and a current switch in contrast having CMOS transistors.

The voltage controlled oscillator circuit according to the invention combines the advantages of the CMOS transistor with those of the bipolar transistor in one circuit.

In accordance with another feature of the invention, the tuned circuit is a differential tuned circuit having a symmetrical construction and having the integrated varactor, another integrated varactor, two capacitors, and the integrated spiral inductance connected in common to the two capacitors.

In accordance with a further feature of the invention, the oscillator circuit is produced by a BiCMOS semiconductor process.

In accordance with a concomitant feature of the invention, the oscillator circuit is used as a UHF oscillator in radio devices for a DECT (Digital European Cordless Telecommunications) system, or a radio system of similar type.

Other features which are considered as characteristic for the invention are set forth in the appended claims.

Although the invention is illustrated and described herein as embodied in a fully integratable voltage controlled oscillator (VCO) circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a schematic circuit diagram of a voltage controlled oscillator circuit according to the invention.

DESCRIPTION OF THE PREFERRED EMBODIMENTS

Referring now in detail to the single FIGURE drawing, there is seen a VCO which can be fully integrated and has an integrated spiral inductance L in parallel with two integrated varactors V1 and V2 that is used as a symmetrical tuned circuit of differential construction. The tuned circuit also contains two capacitors C1 and C2, which are mutually symmetrical.

A control voltage Ur of the VCO which governs the frequency is fed to an input 1 and acts on a pn junction of the two varactors V1 and V2, so that a total capacitance of the tuned circuit, and thus its oscillation frequency, can be varied. Damping of the tuned circuit is counteracted by an NIC (Negative Impedance Converter) type circuit, which transforms a negative resistance into the tuned circuit.

However, in this case, cross-coupling of the NIC circuit is not achieved by using an emitter follower, but instead by AC coupling of two outputs with the aid of two capacitances C3 and C4. To be precise, in this case, a bipolar transistor is used as the current source transistor, specifically a parallel circuit formed by bipolar transistors T1 to T4. This measure in this case makes use of the advantages of the low 1/f noise of bipolar transistors, which is particularly advantageous with regard to setting operating points.

A current signal CURRENT is fed to an input 2 of the current source. Two CMOS transistors T5 and T6 are used in a current switch, in order to utilize a lower gradient "gm" (Ic/UT) of this type of transistor in this case. The relatively low gradient "gm" of CMOS transistors means that the noise produced at the current switch changeover time is negligibly low.

Differential sinusoidal output oscillations OUTP and OUTN are tapped off at outputs 3 and 4 of the voltage controlled oscillator circuit shown in the FIGURE. A DC operating voltage Vcc is used in conjunction with other transistors, which need not be explained in more detail, to provide a suitable voltage supply for the illustrated oscillator circuit. Reference symbol GND denotes the ground pole of the illustrated oscillator circuit which can be fully integrated.

The described circuitry in the exemplary embodiment of a VCO according to the invention allows phase noise levels which are improved by up to 7 dB to be achieved when using the DECT standard, and up to a total of −146 dBc/Hz at an offset of 4.7 MHz from the carrier, as compared with a fully integrated VCO oscillator circuit which is formed purely by bipolar transistors.

It is evident that, in a fully integrated oscillator which is constructed purely by using bipolar technology, the limiting elements are the current switch transistors, while with the BiCMOS oscillator, the limiting elements are the parasitic elements of the tuned circuit inductance.

I claim:

1. A fully integratable voltage controlled oscillator circuit for producing sinusoidal UHF oscillations, comprising:

a tuned circuit including an integrated spiral inductance connected in parallel with an integrated varactor, said integrated varactor having a pn junction acted on by a VCO control voltage governing a resonant frequency;

an NIC (Negative Impedance Converter) circuit transforming a negative real resistance into said tuned circuit for counteracting damping of said tuned circuit, said NIC circuit having two outputs AC coupled for cross-coupling of said NIC circuit;

bipolar transistors provided only as current source transistors; and a current switch having CMOS transistors.

2. The oscillator circuit according to claim 1, wherein said tuned circuit is a differential tuned circuit having a symmetrical construction and having said integrated varactor, another integrated varactor, two capacitors, and said integrated spiral inductance connected in common to said two capacitors.

3. A fully integratable voltage controlled oscillator circuit produced by a BiCMOS semiconductor process for producing sinusoidal UHF oscillations, comprising:

a tuned circuit including an integrated spiral inductance connected in parallel with an integrated varactor, said integrated varactor having a pn junction acted on by a VCO control voltage governing a resonant frequency;

an NIC (Negative Impedance Converter) circuit transforming a negative real resistance into said tuned circuit for counteracting damping of said tuned circuit, said NIC circuit having two outputs AC coupled for cross-coupling of said NIC circuit;

bipolar transistors provided only as current source transistors; and a current switch having CMOS transistors.

4. A fully integratable voltage controlled oscillator circuit for producing sinusoidal UHF oscillations in radio devices for a DECT (Digital European Cordless Telecommunications) or similar system, comprising:

a tuned circuit including an integrated spiral inductance connected in parallel with an integrated varactor, said integrated varactor having a pn junction acted on by a VCO control voltage governing a resonant frequency;

an NIC (Negative Impedance Converter) circuit transforming a negative real resistance into said tuned circuit for counteracting damping of said tuned circuit, said NIC circuit having two outputs AC coupled for cross-coupling of said NIC circuit;

bipolar transistors provided only as current source transistors; and a current switch having CMOS transistors.

* * * * *